(12) United States Patent
Kawaguchi et al.

(10) Patent No.: US 6,733,886 B2
(45) Date of Patent: May 11, 2004

(54) LAMINATE AND METHOD OF MANUFACTURING THE SAME

(75) Inventors: Mutsuyuki Kawaguchi, Amagasaki (JP); Jun Hisada, Amagasaki (JP); Toshiko Nakagawa, Amagasaki (JP)

(73) Assignee: MEC Company Ltd., Amagasaki (JP)

( * ) Notice: Subject to any disclaimer, the term of this patent is extended or adjusted under 35 U.S.C. 154(b) by 0 days.

(21) Appl. No.: 10/131,771

(22) Filed: Apr. 23, 2002

(65) Prior Publication Data

US 2002/0192460 A1 Dec. 19, 2002

(30) Foreign Application Priority Data

Apr. 25, 2001 (JP) ......................................... 2001-127885

(51) Int. Cl.$^7$ .............................................. B32B 15/08
(52) U.S. Cl. ....................... 428/418; 428/413; 428/414; 428/624; 428/626; 428/910; 156/151; 156/325; 156/327
(58) Field of Search .................................. 428/418, 413, 428/414, 624, 626, 910, 417; 156/151, 325, 327; 106/14.42, 287.2; 252/182.12

(56) References Cited

U.S. PATENT DOCUMENTS

| | | |
|---|---|---|
| 3,645,772 A | 2/1972 | Jones |
| 3,837,964 A | 9/1974 | Cotton et al. |
| 3,933,531 A | 1/1976 | Sawa et al. |
| 4,093,768 A | 6/1978 | Cordts et al. |
| 4,622,097 A | 11/1986 | Tsukagoshi et al. |
| 5,362,334 A | 11/1994 | Adams et al. |
| 5,439,783 A | 8/1995 | Akiyama et al. |
| 5,496,590 A | 3/1996 | Maki et al. |
| 5,532,094 A | 7/1996 | Arimura et al. |
| 5,807,493 A | 9/1998 | Maki et al. |
| 6,106,899 A | 8/2000 | Nakagawa et al. |
| 6,372,027 B1 * | 4/2002 | Tomaiuolo et al. ...... 106/14.42 |
| 6,512,186 B1 * | 1/2003 | Nishiwaki et al. .......... 174/261 |

FOREIGN PATENT DOCUMENTS

| | | |
|---|---|---|
| EP | 0 428 383 | 5/1991 |
| EP | 0 814 644 | 12/1997 |
| JP | 61-266241 A | 11/1986 |
| JP | 6-287774 A | 10/1994 |
| JP | 7-292483 A | 11/1995 |
| JP | 2740768 | 1/1998 |
| JP | 11-43778 A | 2/1999 |
| JP | 2923524 | 5/1999 |
| JP | 2923596 | 5/1999 |
| WO | 96/19097 | 6/1996 |

* cited by examiner

Primary Examiner—Robert Dawson
Assistant Examiner—Christopher Keehan
(74) Attorney, Agent, or Firm—Merchant & Gould P.C.

(57) ABSTRACT

A laminate is made by adhering at least one metal layer selected from the group consisting of copper and a copper alloy to a resin layer. A coating film of an azole-copper complex compound formed by a contact with an aqueous solution containing an azole compound in an range from 0.1 mass % to 15 mass % and an organic acid in a range from 1 mass % to 80 mass % is formed on the metal layer surface, and the metal layer adheres to the resin layer via the coating film of the azole-copper complex compound. Thereby, the present invention provides a laminate with improved adhesion between a surface of copper or a copper alloy and resin in a multilayered printed circuit board, and also a method of manufacturing the laminate.

14 Claims, 2 Drawing Sheets

LAMINATE AND METHOD OF MANUFACTURING THE SAME

BACKGROUND OF THE INVENTION

1. Field of the Invention

The present invention relates to a laminate with improved copper-resin adhesion that is useful for manufacturing a laminate of copper/copper alloy (hereinafter, noted simply as copper) and resin, i.e., a printed circuit board, and a method of manufacturing the laminate.

2. Description of the Related Art

A multilayered printed circuit board has a laminate having a plurality of electroconductive layers with insulating layers interposed therebetween. Through-holes for electrical connection of the respective electroconductive layers are formed on the multilayered printed circuit board, and the multilayered printed circuit board has an inner surface plated with copper. Alternatively, the through-holes are filled with an electroconductive paste.

The conductive layers comprise copper while the insulating layer comprises resin, which have poor adhesion to each other. For improving the adhesion of copper to resin, in general, a copper surface is blackened, i.e., treated with a high-temperature strong-alkali aqueous solution so as to form a fine acicular copper oxide thereon. The method is called a black oxide technique.

However, the acicular copper oxide formed on the copper surface will be dissolved easily in an acidic plating solution during a step of plating the through-holes. The phenomenon in which the copper oxide is dissolved is called haloing. A method applied for avoiding this problem is reduction of the acicular copper oxide into copper with a reducer while keeping its shape, so that the copper oxide becomes difficult to dissolve in an acidic plating solution. However, this method is not desirable since it increases the steps in the process of an already inherently-inefficient blackening treatment that takes much time.

Another production method with fewer steps for improving adhesion of the copper surface to resin is roughening the copper surface with a microetchant.

For example, JP 2923524 describes roughening a copper surface by using an aqueous solution containing a cupric ion, an organic acid having an acid dissociation constant (pKa) of not more than 5, and a halogenous ion. However, simple roughening of a copper surface cannot always provide sufficient adhesion to resin.

JP 2740768 describes the use of an aqueous solution containing an inorganic acid, an oxidizer, a corrosion inhibitor such as azole and also a surfactant, for etching and roughening the copper surface and at the same time, for forming an azole complex on the copper surface.

However, since the oxidizer will be decomposed easily, etching and formation of the azole complex tend to be unstable, resulting in insufficient adhesion to resin.

Any of U.S. Pat. No. 36,455,772, JP-A-61(1986)-266241, and JP-A-11(1999)-43778 describes a method of forming a coating film on a copper surface by adsorbing an azole compound in the surface, thereby improving its adhesion to resin.

However, since the aqueous solution of the azole compound contains no organic acids, the coating film of the azole compound formed on the copper surface is thin and insufficient in adhesion to resin.

JP-A-6(1994)-287774 describes a copper microetchant containing an azole compound, a cupric ion source, an organic acid and a complexing agent. JP-A-7(1995)-292483 describes a copper microetchant containing an azole compound, a cupric ion source, an organic acid and a halogenous ion.

Since each of these solutions containing azole compounds and organic acids is used for etching copper using oxidizability provided by the cupric acid complex of the azole compound, it cannot form a thick film of an azole compound on the copper surface.

JP 2923596 describes a copper anti-tarnish, which comprises an aqueous solution containing an imidazole compound, an organic acid, and a copper compound. However, the invention does not refer to adhesion between a copper plate and resin.

As described above, various methods to replace blackening in manufacturing a multilayered printed circuit board have been studied to improve the adhesion of the copper surface to resin, while satisfactory methods have not been developed yet.

SUMMARY OF THE INVENTION

For solving the above-mentioned problems, the present invention provides a laminate with improved adhesion between a surface of copper/copper alloy and a resin in a multilayered printed circuit board, and a method of manufacturing the laminate.

For achieving this object, a laminate according to the present invention is formed by adhering at least one layer of a metal selected from copper and a copper alloy to a resin layer, wherein an azole-copper complex compound coating film is formed by a contact between the surface and an aqueous solution containing an azole compound in a range from 0.1 mass % to 15 mass % and an organic acid in a range from 1 mass % to 80 mass %, and the metal layer and the resin layer are adhered to each other via the coating film of the azole-copper complex compound.

A method of manufacturing a laminate according to the present invention is used for manufacturing a laminate by adhering at least one metal layer selected from copper and a copper alloy to a resin layer, including formation of a coating film of an azole-copper complex compound by contacting the surface of the metal layer with an aqueous solution containing an azole compound in a range from 0.1 mass % to 15 mass % and an organic acid in a range from 1 mass % to 80 mass %, and adhering the metal layer and the resin layer via the coating film of the azole-copper complex compound.

A solution for forming an azole-copper complex compound according to the present invention comprises an aqueous solution containing an azole compound in a range from 0.1 mass % to 15 mass % and an organic acid in a range from 1 mass % to 80 mass %.

DETAILED DESCRIPTION OF THE INVENTION

Figure 1:
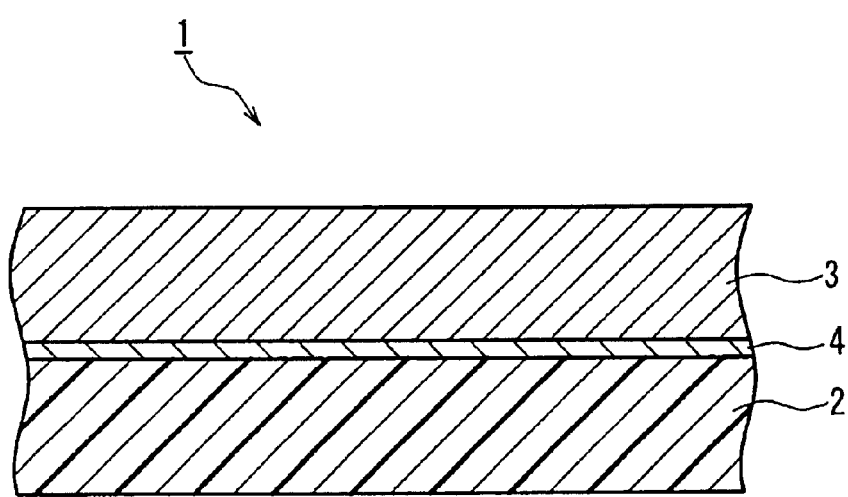
FIG. 1 is a schematic cross-sectional view of a laminate in one embodiment of the present invention.

The inventors discovered that a thick coating film of an azole compound is formed on a copper surface by contacting the copper surface with an aqueous solution containing an azole compound and an organic acid, thereby improving remarkably the adhesion between the copper surface and resin.

Specifically, the present invention is achieved by:

(1) contacting a surface of copper or a copper alloy with an aqueous solution containing an azole compound in a range 0.1 mass % to 15 mass % and an organic acid in a range from 1 mass % to 80 mass % in order to form a coating film of the azole compound on the surface and improve adhesion between the surface of copper/copper alloy and resin; or (2) contacting a surface of copper or a copper alloy with an aqueous solution containing an azole compound in a range 0.1 mass % to 15 mass % and an organic acid in a range from 1 mass % to 80 mass % in order to form a coating film of the azole compound on the surface, and subsequently contacting the copper/copper alloy with a resin so as to obtain a laminate.

In the present invention, an azole compound is a generic name for a five-member-aromatic compound that contains at least two hetero atoms and at least one of the hetero atoms is a nitrogen atom.

The azole compound to be blended in an aqueous solution is a substance that forms a complex as a result of a reaction with copper so as to form a coating film on the copper surface.

The azole compound is, for example, at least one compound selected from the group consisting of diazole, oxazole, thiazole, triazole, oxadiazole, thiadiazole, tetrazole, oxatriazole, thiatriazole, and derivatives thereof though the examples are not limitative.

Specific examples of the azole compound include oxazole; isoxazole; 5-t-butylisoxazole-3-carboxylic acid; thiazole; isothiazole; 2-amino-4-methyl-thiazole; 2-mercapto-2-thiazoline; imidazole; pyrazole; 1-methyl-2-mercaptoimidazole; 1-($\beta$-hydroxyethyl)-2-methylimidazole; 1-($\beta$-chloroethyl)-2-methylimidazole; 2-amino benzimidazole; 3-$\beta$-aminoethyl pyrazole; triazole; 3-amino-1,2,4-triazole; 4-amino-1,2,4-triazole; 3,5-diamimo-1,2,4-triazole; 3-amino-1,2,4-triazole-5-caboxylic acid; 1,2,3-benzotriazole; oxadiazole; 2,5-bis(4-aminophenyl)-1,3,4-oxadiazole; thiadiazole; 2-(N-nitro-N-methylamino)-1,3,4-thiadiazole; tetrazole; 5-aminotetrazole; 1-($\beta$-aminoethyl)tetrazole; 5-mercapto-1-phenyltetrazole; oxatriazole; thiatriazole; and 5-amino-1,2,3,4-thiatriazole.

Among them, a preferred azole compound has 2–4 nitrogen atoms in the ring and/or it has a group to react with resin, e.g., an amino group, a carboxyl group, a hydroxyl group and halogen, in view of the capability of forming complexes with copper, and adhesion to resins. The examples include 1-($\beta$-hydroxyethyl)-2-methylimidazole; 1-($\beta$-chloroethyl)-2-methylimidazole; 3-$\beta$-aminoethyl pyrazole; 3-amino-1,2,4-triazole; 4-amino-1,2,4-triazole; 3,5-diamimo-1,2,4-triazole; 3-amino-1,2,4-triazole-5-caboxylic acid; 5-aminotetrazole; and 1-($\beta$-aminoethyl)tetrazole.

Each of the above-described azole compounds can be used alone or combined with at least one of the other azole compounds.

The concentration of the azole compound in the aqueous solution is in a range from 0.1 mass % to 15 mass %, preferably from 1 mass % to 5 mass %.

When the concentration of the azole compound is lower than 0.1 mass %, a coating film of the azole compound becomes thin and thus it cannot provide sufficient effects for improving adhesion to the resin, while the azole compound often will be difficult to dissolve when the concentration exceeds 15 mass %.

The aqueous solution used in the present invention contains an organic acid in order to acidify this aqueous solution to have a pH ranging from 1 to 5, or more preferably ranging from 1 to 4. By acidifying the aqueous solution, a thick coating film of the azole compound is formed on the copper surface.

It is preferable that the coating film has a thickness of at least 0.05 g/m$^2$ in a measurement based on the coating amount, more preferably, in a range from 0.1 g/m$^2$ to 10 g/m$^2$.

When the coating amount is 0.05 g/m$^2$ or more, sufficient effects are obtained in improving adhesion to resin. A coating amount of not more than 10 g/m$^2$ creates increased effects corresponding to increased coating amount, resulting in cost reduction.

The coating amount can be measured by e.g., a quantitative analysis and a gravimetric analysis. In the quantitative analysis, the coating film is dissolved in a solution such as an acidic solution that dissolves the film in order to quantitatively analyze the azole amount in the solution by a liquid chromatography method, an ultraviolet absorption spectral method or the like.

Specific examples of the organic acid include formic acid, acetic acid, propionic acid, octylic acid, glycolic acid, n-butyric acid, isobutyric acid, acrylic acid, crotonic acid, isocrotonic acid, oxalic acid, malonic acid, succinic acid, adipic acid, maleic acid, acetylenedicarboxylic acid, monochloroacetic acid, trichloroacetic acid, monobromoacetic acid, lactic acid, oxylactic acid, glyceric acid, tartaric acid, malic acid, citric acid, L-thiamine, pyroglutaric acid, pyrrolidine-2,4-dicarboxylic acid, folic acid, DL-threonine, L-threonine, L-tryptophane, L-phenylalanine, and quinaldinic acid.

Among the above-described examples, preferred organic acids include formic acid, acetic acid, lactic acid, malic acid, citric acid or the like since they are inexpensive, highly soluble in water, and less odorous. Each of the organic acids can be used alone or combined with at least one of the remaining organic acids.

A preferred range of concentration of the organic acids need not be defined strictly since it varies depending on azole compounds and organic acids. However, it is generally in a range from 1 mass % to 80 mass %, and preferably in a range from 1 mass % to 30 mass % in view of operability of the aqueous solution.

When the concentration of the organic acid is lower than 1 mass %, a pH of the solution cannot be decreased sufficiently. As a result, the azole compound film coated on the copper surface becomes thin. A concentration of more than 80 mass % may only raise the production cost.

Various additives can be blended in the aqueous solution used for the process of the present invention as long as a coating film of the azole compound can be formed.

Such an additive can be selected from, for example, aqueous solvents such as alcohols for increasing solubility of the azole compound; nonionic surfactants such as polyether, a copolymer of ethylene oxide and propylene oxide (Pluronic type), and amino-based polyether for improving homogeneity of the coating film; and metal compounds for improving formation of coating films of an azole compound, such as zinc acetate, zinc hydroxide, zinc formate, copper chloride, copper formate, copper acetate, lead acetate, nickel acetate, and nickel sulfide.

The aqueous solution can be prepared easily by dissolving any of the above-described substances in water. The water is selected preferably from ion exchange water, pure water, extra-pure water from which ionic materials and impurities are removed.

There are no specific limitations about copper surfaces to be treated by the method of the present invention. The examples include copper surfaces such as a copper foil, an electroless copper plating film, an electrolytic plating film, and a copper-sputtering film; and an IC lead frame. A copper alloy containing copper in at least 50 mass % can be used. The copper can contain other ingredients such as silicon, tin, nickel, zinc, phosphorus, chromium, zirconium, magnesium, titanium, and silver.

The surface can be roughened for improving further its adhesion to resin, by microetching, electrolytic plating, electroless plating, oxidation (black oxide, and brown oxide), oxidation-reduction, brush-polishing, jet-scrubbing and the like.

A combination of anchoring effects due to the roughening and chemical adhesion effects due to the coating of the thick azole compound serves to improve the adhesion to resin considerably.

Examples of the above-described microetching include etching treatments using, for example, a sulfuric acid-hydrogen peroxide type etchant, a persulfate type etchant, a copper chloride type etchant, a ferric chloride type etchant, and an alkaline etchant; and an etching treatment using, for example, CZ-8100 supplied by MEC Co., Ltd.

A method of contacting an aqueous solution with the copper surface is selected from, for example, spraying, showering, and dipping. Later the copper will be washed with water and dried.

The temperature of the aqueous solution during a contact with the copper surface is preferably in a range from 20° C. to 40° C., and preferably a period for the contact is in a range from 5 seconds to 120 seconds.

The surface treatment according to the present invention can be used for various applications. It is useful, for example, in a surface treatment of copper wires used for LSIs, printed circuit boards or the like, lead frames and semiconductor mount boards.

A copper surface treated by a method of the present invention can have an improved adhesion to resins such as a dry film resist, a liquid resist, an electrodeposited resist, a pre-preg, a solder resist, an adhesive, an interlayer insulating resin of a build-up wiring board, and a resin for semiconductor sealing.

Examples of the resins include, for example, phenol resin, epoxy resin, heat-resistant epoxy resin, polyimide, polyester, bismaleimide-triazine resin, fluorine resin, isocyanate resin, and polyphenylene ether, though these examples are not limitative.

There is no specific limitation about methods for adhering a resin to a copper surface coated with an azole compound, but any appropriate methods can be selected depending on the resins. In an example, a copper surface is provided with a liquid resin before curing the resin by heat and light. Alternatively, a film-shaped resin or a resin-impregnated fabric is adhered onto the copper surface before pressing while applying heat.

Laminates such as LSIs and printed circuit boards manufactured according to the present invention are highly reliable and excellent in the adhesion between copper layers and resin layers.

A laminate in one example of the present invention will be described below referring to FIG. 1. FIG. 1 is a schematic cross-sectional view of one example of the present invention. A laminate 1 is made by adhering at least one metal layer 3 selected from copper and a copper alloy to a resin layer 2. On the metal layer 3, a coating film 4 of an azole-copper complex is formed as a result of a contact between the surface of the metal layer and an aqueous solution containing an azole compound in a range from 0.1 mass % to 15 mass %, and an organic acid in a range from 1 mass % to 80 mass %. The metal layer 3 and the resin layer 2 are adhered to each other via the coating film 4 of the azole-copper complex compound. Thereby, a laminate with improved adhesion between resin and a surface of copper or a copper alloy of a multilayered printed circuit board and a method of manufacturing the laminate are provided.

EXAMPLES

The present invention will be described below in further detail by examples.

Examples 1–7 and Comparative Examples 1–4
(1) Interlayer Stripping Test

Copper on a surface of a copper-clad laminate of a printed circuit board was etched to about 3 $\mu$m with CZ-8100 (a microetchant supplied by MEC Co., Ltd.). This etching amount was a converted value obtained from the weight, the surface area and the specific density of the dissolved copper. Subsequently, an aqueous solution of each composition shown in Table 1 was prepared, in which an etched laminate was dipped for 15 seconds at 20° C. The laminate was then washed with water, dried, and thus an azole-copper complex compound film was formed on copper surface.

The thus obtained laminate was laminated with two sheets of glass epoxy pre-preg ("GEA-67N" supplied by Hitachi Chemicals Co., Ltd.) 0.1 mm in thickness of a FR-4 grade (defined under ASTM and NEMA standards). This was heated and pressed under conditions of a temperature ranging from 130° C. to 180° C. and a molding-pressure ranging from 0.5 MPa to 3 MPa. The heating time was determined to be at least 40 minutes when the pre-preg temperature was at least 170° C.

The thus obtained laminate was degraded for 2 hours under a condition of 121° C., 100% RH, and a pressure of 2 atmospheres. The laminate was dipped in a melted solder (260° C.) for 1 minute before examining interlayer stripping between the resin and the copper Sing of the pre-preg from the copper surface). The results are shown in Table 1.

In Table 1, 'A' indicate that no lifting occurs. 'B' indicates the occurrence of lifting such as measling (spot-like minute swelling), and 'C' indicates that lifting occurred at many portions.

The coating amount shown in Table 1 was quantified by a liquid chromatography method after dissolving the azole compound formed on the copper surface in a methanol solution containing 0.1 mass % hydrochloric acid.

(2) Peeling Strength Test

Surfaces of electrolytic copper foils respectively 35 $\mu$m in thickness were etched to 3 $\mu$m using CZ-8100 (a product supplied by MEC Co., Ltd.). The etched copper foils were dipped for 15 seconds at 20° C. in the aqueous solutions shown in Table 1. Then, the copper foils were washed with water and dried.

Each of the thus obtained copper foils was laminated with two sheets of glass epoxy pre-preg ("GEA-67N" supplied by Hitachi Chemicals Co., Ltd.) 0.1 mm in thickness of a FR-4 grade (defined under ASTM and NEMA standards). This was heated and pressed under conditions of a temperature ranging from 130° C. to 180° C. and a molding-pressure ranging from 0.5 MPa to 3 MPa, so that a laminate was produced. The time for heating was determined to be at least 40 minutes when the pre-preg temperature was at least 170° C.

Figures 2A, 2B:
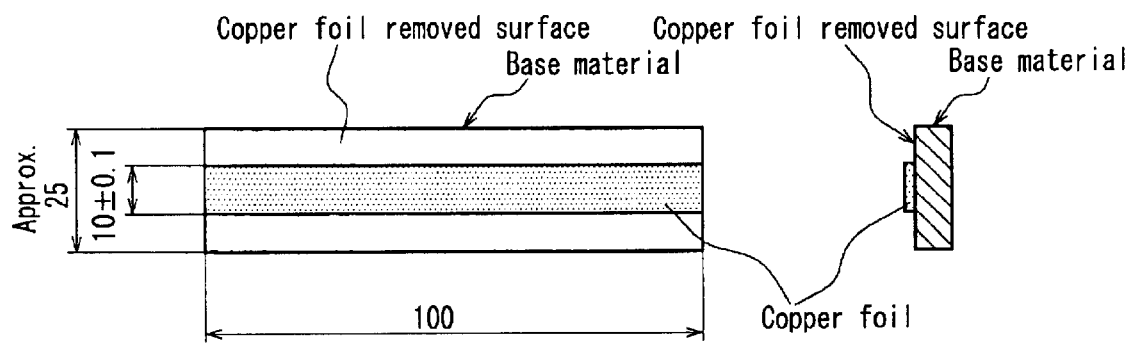
FIG. 2A is a plan view of a copper-clad laminate used as a sample for a peeling strength test in any of examples and comparative examples of the present invention.
FIG. 2B is a cross-sectional view thereof.
Figure 3:
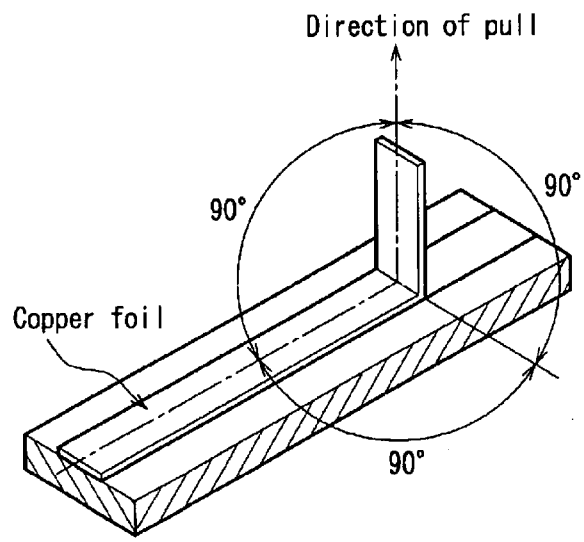
FIG. 3 a perspective view of the copper clad laminate during the peeling strength test.

The peeling strength of each of the thus obtained copper foils was evaluated pursuant to JIS C 6481. For the evaluation, a specimen was made by: cutting out a piece of dimensions specified in FIGS. 2A and 2B from the copper-clad laminate; and removing the copper foil on both sides by cutting with a knife so as to leave the copper foil of 10±0.1 mm width on the middle part of one side. The specimen was set on a supporting device after detaching the copper foil on one end to an appropriate length, and the end of detached copper foil was clamped with a clamping device. The copper foil was peeled to about 50 mm continuously at a speed of about 50 mm per minute in a direction perpendicular to the copper foil surface as shown in FIG. 3. The minimum value of the load during this operation is defined as the peel strength and expressed in kN/m. If the copper foil breaks in this process, a retest will be carried out.

The results are shown in Table 1.

TABLE 1

| Test No. | Aqueous solution composition | (mass %) | Aqueous solution pH | Coating amount ($g/m^2$) | Interlayer stripping | Peeling strength (kgf/cm) |
|---|---|---|---|---|---|---|
| E.1 | 3-amino-1,2,4-triazole | 3.0 | 2.5 | 1.02 | A | 1.22 |
|  | formic acid | 10 |  |  |  |  |
|  | ion exchange water | balance |  |  |  |  |
| E.2 | 3-amino-1,2,4-triazole | 15.0 | 3.0 | 1.55 | A | 1.24 |
|  | formic acid | 10.0 |  |  |  |  |
|  | ion exchange water | balance |  |  |  |  |
| E.3 | 3-amino-1,2,4-triazole | 2.0 | 2.5 | 1.25 | A | 1.20 |
|  | 3-amino-1,2,4-triazole-5-carboxylic acid | 1.0 |  |  |  |  |
|  | formic acid | 10.0 |  |  |  |  |
|  | ion exchange water | balance |  |  |  |  |
| E.4 | 3-β-aminoethylpyrazole | 5.0 | 3.3 | 0.73 | A | 1.23 |
|  | acetic acid | 15.0 |  |  |  |  |
|  | ion exchange water | balance |  |  |  |  |
| E.5 | 3-amino-1,2,4-trizole | 3.0 | 2.4 | 0.92 | A | 1.22 |
|  | formic acid | 10.0 |  |  |  |  |
|  | acetic acid | 5.0 |  |  |  |  |
|  | ion exchange water | balance |  |  |  |  |
| E.6 | 5-aminotetrazole | 0.1 | 2.2 | 0.05 | A | 1.19 |
|  | formic acid | 1.0 |  |  |  |  |
|  | ion exchange water | balance |  |  |  |  |
| E.7 | 3-amino-1,2,4-triazole | 3.0 | 1.0 | 1.13 | A | 1.21 |
|  | acetic acid | 40.0 |  |  |  |  |
|  | ion exchange water | balance |  |  |  |  |
| C.1 | 3-amino-1,2,4-triazole | 3.0 | 6.0 | 0.01 | C | 1.18 |
|  | ion exchange water | balance |  |  |  |  |
| C.2 | Formic acid | 10.0 | 1.9 | 0 | C | 1.15 |
|  | ion exchange water | balance |  |  |  |  |
| C.3 | 3-amino-1,2,4-triazole | 0.05 | 2.0 | 0.004 | C | 1.17 |
|  | formic acid | 10.0 |  |  |  |  |
|  | ion exchange water | balance |  |  |  |  |
| C.4 | 3-amino-1,2,4-triazole | 3.0 | 5.3 | 0.02 | B | 1.16 |
|  | formic acid | 0.1 |  |  |  |  |
|  | ion exchange water | balance |  |  |  |  |

Note
E.: Example; C.: Comparative Example

As indicated in Table 1, interlayer stripping did not occur in the laminates of Examples 1–8 and the peeling strength in Examples 1–7 was 1.19 kgf/cm or more.

To the contrary, the laminates of Comparative Examples 1–4 had interlayer stripping.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, all changes that come within the meaning and range of equivalency of the claims are intended to be embraced therein.

What is claimed is:

1. A laminate comprising at least one metal layer selected from copper and a copper alloy and also a resin layer adhered to the metal layer, wherein an azole-cooper complex compound coating film is formed on a surface of the metal layer by a contact between the surface and an aqueous solution containing an azole compound in a range from 0.1 mass % to 15 mass % and an organic acid in a range from 1 mass % to 80 mass %,
    wherein the azole-copper complex compound coating film has a range from 0.1 $g/m^2$ to 10 $g/m^2$ in terms of a coating amount per square meter, and the metal layer and the resin layer are adhered to each other via the coating film of the azole-copper complex compound.

2. The laminate according to claim 1, wherein the azole-copper complex compound coating film comprises a complex compound of copper and at least one compound selected from the group consisting of diazole, oxazole, thiazole, triazole, oxadiazole, thiadiazole, tetrazole, oxatriazole, thiatriazole, and derivatives thereof.

3. The laminate according to claim 1, wherein the resin is a least one selected from the group consisting of phenolic resin, epoxy resin, heat-resistant epoxy resin, polyimide, polyester, bismaleimide-triazine resin, fluororesin, isocyanate resin and polyphenylene ether.

4. The laminate according to claim 1, wherein the resin is at least one resin selected from the group consisting of a dry film resist, a liquid resist, an electrodeposited resist, a pre-preg of a resin-impregnated fiber structure, a solder resist, an adhesive, a build-up printed circuit board, and a semiconductor sealing resin.

5. The laminate according to claim 1, wherein the organic acid is at least one acid selected from the group consisting of formic acid, acetic acid, propionic acid, octylic acid, glycolic acid, n-butyric acid, oxalic acid, malonic acid, succinic acid, adipic acid, maleic acid, acetylenedicarboxylic acid, monochloroacetic acid, trichloroacetic acid, monobromoacetic acid lactic acid, oxylactic acid, glyceric acid, tartaric acid, malic acid, citric acid, L-thiamine, pyroglutaric acid, pyrrolidine-2,4-dicarboxylic acid, folic acid, DL-threonine, L-threonine, L-tryptophane, L-phenylalanine and quinaldinic acid.

6. A method of manufacturing a laminate through adhesion of at least one metal layer selected from a group consisting of copper and a copper alloy to a resin layer, the method comprising:

forming a coating film of an azole-copper complex compound by contacting a surface of the metal layer with an aqueous solution containing an azole compound in a range from 0.1 mass % to 15 mass % and an organic acid in a range from 1 mass % to 80 mass %, wherein the azole-copper compound coating film has a range from 0.1 $g/m^2$ to 10 $g/m^2$ in terms of a coating amount per square meter, and coating the metal layer and the resin layer via the coating film of the azole-copper complex compound.

7. The manufacturing method according to claim 6, wherein the aqueous solution has a pH ranging from 1 to 5.

8. The manufacturing method according to claim 6, wherein the azole-copper complex compound coating film comprises a complex compound of copper and at least one compound selected from the group consisting of diazole, oxazole, thiazole, triazole, oxadiazole, thiadiazole, tetrazole, oxatriazole, thiatriazole, and derivatives thereof.

9. The manufacturing method according to claim 6, wherein the resin is at least one selected from the group consisting of phenolic resin, epoxy resin, heat-resistant epoxy resin, polyimide, polyester, bismaleimide-triazine resin, fluororesin, isocyanate resin and polyphenylene ether.

10. The manufacturing method according to claim 6, wherein the resin is at least one resin selected from the group consisting of a dry film resist, a liquid resist, an electrodeposited resist, a pre-preg of a resin-impregnated fiber structure, a solder resist, an adhesive, a build-up printed circuit board, and a semiconductor sealing resin.

11. The manufacturing method according to claim 6, wherein the organic acid is at least one acid selected from the group consisting of formic acid, acetic acid, propionic acid, octylic acid, glycolic acid, n-butyric acid, isobutyric acid, acrylic acid, crotonic acid, isocrotonic acid, oxalic acid, malonic acid, succinic acid, adipic acid, maleic acid, acetylenedicarboxylic acid, monochloroacetic acid, trichloroacetic acid, malic acid, citric acid, L-thiamine, pyroglutaric acid, pyrrolidine-2,4-dicarboxylic acid, folic acid, DL-threonine, L-threonine, L-tryptophane, L-phenylalanine and quinaldinic acid.

12. The manufacturing method according to claim 6, wherein the metal surface is roughened previously by at least one method selected from the group consisting of microetching, electrolytic plating, electroless plating, black oxide oxidation, brown oxide oxidation, oxidation-reduction, brush-polishing, and jet-scrubbing.

13. A solution for forming an azole-copper complex compound that is used for adhering at least one metal layer selected from the group consisting of copper and a copper alloy to a resin layer, and the azole-copper complex compound coating film has a range from 0.1 $g/m^2$ to 10 $g/m^2$ in terms of a coating amount per square meter on a surface of the metal layer, wherein the solution is an aqueous solution comprising an azole compound in a range from 0.1 mass % to 15 mass % and an organic acid in a range from 1 mass % to 80 mass %, and wherein the azole compound is at least one compound selected from the group consisting of diazole, oxazole, thiazole, triazole, oxadiazole, thiadiazole, tetrazole, oxatriazole, thiatriazole, and derivatives thereof.

14. The solution for forming an azole-copper complex compound according to claim 13, wherein the organic acid is at least one acid selected from the group consisting of formic acid, acetic acid, propionic acid, octylic acid, glycolic acid, n-butyric acid, isobutyric acid, acrylic acid, crotonic acid, isocrotonic acid, oxalic acid, malonic acid, succinic acid, adipic acid, maleic acid, acetylenedicarboxylic acid, monochloroacetic acid, trichloroacetic acid, monobromoacetic acid, lactic acid, oxylactic acid, glyceric acid, tartaric acid, malic acid, citric acid, L-thiamine, pyroglutaric acid, pyrrolidine-2,4-diacarboxylic acid, folic acid, DL-threonine, L-threonine, L-tryptophane, L-phenylalanine and quinaldinic acid.

* * * * *